(12) United States Patent
Pfeiffer et al.

(10) Patent No.: US 7,063,204 B1
(45) Date of Patent: Jun. 20, 2006

(54) PRECISION CONVEYOR

(75) Inventors: Michael W Pfeiffer, Savage, MN (US); Eric D. Johnson, Minneapolis, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/080,242

(22) Filed: Mar. 15, 2005

(51) Int. Cl.
*B65G 47/04* (2006.01)
(52) U.S. Cl. .............................. 198/465.3; 198/465.2
(58) Field of Classification Search ............ 198/465.1, 198/465.2, 465.3, 860.3, 860.5
See application file for complete search history.

(56) References Cited

U.S. PATENT DOCUMENTS

| | | | |
|---|---|---|---|
| 3,610,391 A | 10/1971 | Beck | |
| 3,827,547 A | 8/1974 | Nixon | |
| 4,371,075 A * | 2/1983 | Erlichman | 198/465.2 |
| 4,479,572 A * | 10/1984 | Merz | 198/465.3 |
| 4,492,297 A | 1/1985 | Sticht | |
| 4,530,287 A | 7/1985 | Sticht | |
| 5,012,917 A * | 5/1991 | Gilbert et al. | 198/465.2 |
| 5,388,684 A | 2/1995 | Peck | |
| 5,398,802 A | 3/1995 | Clopton | |
| 5,411,130 A | 5/1995 | Noestheden | |
| 6,008,476 A * | 12/1999 | Neiconi et al. | 198/465.3 |
| 6,191,507 B1 | 2/2001 | Peltier | |
| 6,269,934 B1 | 8/2001 | Baker | |
| 6,378,423 B1 | 4/2002 | Yoshida | |
| 6,460,683 B1 | 10/2002 | Pfeiffer | |
| 6,494,307 B1 | 12/2002 | Kozak | |
| 6,533,101 B1 | 3/2003 | Bonora | |
| 6,554,126 B1 | 4/2003 | Muller | |
| 2004/0031663 A1 | 2/2004 | Ludwig | |

* cited by examiner

*Primary Examiner*—James R. Bidwell
(74) *Attorney, Agent, or Firm*—Shumaker & Sieffert, P.A.

(57) ABSTRACT

This document describes an apparatus and system for conveying components. The apparatus and system include several parts. The apparatus and system include a base that supports a rail. The apparatus and system also includes a pallet assembly that is capable of moving along the rail. The pallet assembly includes first and second surfaces that are separated by a thickness dimension. The apparatus and system also includes a positioning mechanism that is connected to the base. The positioning mechanism includes a drive roller that rotates about a first axis and engages the first surface of the pallet assembly. The positioning mechanism also includes an idler roller that rotates about a second axis, which is generally parallel to the first axis. The idler roller engages the second surface of the pallet assembly. Such an apparatus and system for conveying components may provide for high-acceleration, high-velocity transport of work pieces and may eliminate the need to lift and orient work pieces before performing various operations.

24 Claims, 5 Drawing Sheets

PRECISION CONVEYOR

TECHNICAL FIELD

This document relates to conveying components for manufacture and/or assembly.

BACKGROUND

Many of today's manufacture or assembly processes are almost completely automated, requiring human intervention only for programming which processes to run. Many of these processes require a system to convey work pieces from one station to another. At each station, operations, such as adding components, may be performed on the work pieces.

Conveyor systems take many forms. Belt systems have existed for a long time. More recently, systems have been developed in which work pieces are placed on top of one or more rollers, some of which are drive rollers and others of which are idler rollers. Frictional forces between the work pieces and the drive rollers propel the work pieces along the conveyor system. Sufficient frictional forces, which depend on the weight of the work pieces being conveyed, must be maintained, or the work piece will slip. The likelihood of a work piece slipping is increased as the drive roller accelerates at higher rates and rotates at higher velocities. Higher acceleration rates and velocities are desirable in production because they reduce per-unit manufacturing time.

Many processes, such as the automated production of relatively small electronic or electromechanical devices, require precise work piece positioning. Often, this precise work piece positioning involves conveying the work piece to a more general location, lifting the work piece from the conveyor system, and precisely orienting the work piece so that an operation may be performed on the work piece. This three-step process consumes valuable time. When the consumed time is multiplied by hundreds or thousands of work pieces, the resultant loss in productivity may be substantial.

As the work piece is lifted from the conveyor system and oriented, components may be dislodged from the work pieces. Dislodged components may cause substantial quality assurance problems and may result in diminished productivity. The lift-and-orient operation may also result in damage to the work pieces due to impact shock.

SUMMARY

A conveyor apparatus and system includes actuators that engage a work piece or a pallet assembly with opposing compressive forces that are substantially orthogonal to the direction of movement along the conveyor. The actuators may include rollers, some of which are coupled to one or more drive motors. Embodiments may reduce or eliminate slippage of the work piece or pallet assembly, thereby enabling work pieces or pallet assemblies to achieve high-acceleration, high-velocity precision transport along a conveyor. Certain embodiments may also support work pieces so as to permit access to the work piece from several directions, which may substantially eliminate the need to lift and orient work pieces before performing various operations.

In one aspect, an apparatus for conveying components includes a base and a rail that is supported by the base. The apparatus also includes a pallet assembly that is supported with respect to the rail by opposing compressive forces that are substantially orthogonal to the direction of movement along the rail. The apparatus also includes a positioning mechanism connected to the base. The positioning mechanism includes a drive roller to rotate about a first axis. The drive roller engages the pallet assembly and provides a compressive force on a surface of the pallet assembly in a direction orthogonal to the direction of movement along the rail In an embodiment, the pallet assembly may also include a flexible sheet attached to a plate. The sheet may include first and second surfaces separated by a thickness dimension. The positioning mechanism may also include an idler roller to rotate about a second axis, which may be generally parallel to the first axis. The drive roller may engage the first surface of the sheet and the idler roller may engage the second surface of the sheet, thereby providing, on opposing surfaces of the sheet, opposing compressive forces that are orthogonal to the direction of movement along the rail.

In a second aspect, a system for conveying components is provided. The system includes a first base and a first rail segment that is supported by the first base. The system also includes a plurality of pallet assemblies. Each pallet assembly is capable of moving along the first rail segment substantially without slippage. The system also includes a plurality of positioning mechanisms. Each positioning mechanism is connected to the first base and includes a drive roller to rotate about a first axis. The drive rollers can engage the pallet assemblies.

Each pallet assembly may include a flexible sheet attached to a plate. Each positioning mechanism may also include an idler roller to rotate about a second axis, which may be generally parallel to the first axis. The drive rollers may engage the first surfaces of the sheets and the idler rollers may engage the second surfaces of the sheets.

In a third aspect, a system for conveying components includes a base and a plurality of drive rollers. Each drive roller is supported by the base and is able to rotate about a substantially vertical axis. The system also includes a plurality of idler rollers. Each idler roller is supported by the base and is able to rotate about a substantially vertical axis. The drive rollers are able to engage a vertical surface of a work piece, and the idler rollers are able to engage an opposing vertical surface of the work piece.

Certain embodiments may have one or more advantages. For example, manufacture and assembly of certain work pieces may be achieved in a simple manner. Operations may be performed on a work piece without first lifting and orienting the work piece, which can consume valuable time. Work pieces may be positioned precisely according to predetermined controls, and operations may be performed without having to break contact between the rollers and the work piece or corresponding pallet assemblies. Electrostatic charge build-up between the work piece and the conveyor may be controlled. Slippage may be reduced by increased friction between the rollers and the work pieces or pallet assemblies. Such advantages may further yield benefits, including increased work piece acceleration and velocity rates, substantially reduced likelihood that the work piece or its components will be damaged or dislodged by lift and orient operations, and substantially reduced per-unit manufacturing times.

The details of one or more implementations are set forth in the accompanying figures and the description below. Other features, objects, and advantages will be apparent from the description and drawings, and from the claims.

DESCRIPTION OF FIGURES

Like reference symbols in the various figures indicate like elements.

DETAILED DESCRIPTION OF ILLUSTRATIVE EMBODIMENTS

The apparatus for conveying an object, work piece, or pallet assembly may include at least one element for engaging opposing surfaces of an object with offsetting compressive forces. The engaging elements may be rollers of the type described herein, or their equivalents. The conveyor system may also include at least one actuator for driving the engaging elements to move the object in a direction substantially orthogonal to the offsetting compressive forces. The actuator, which may be an electric motor or equivalents thereof, may be coupled to at least one of the engaging elements. Illustrative and exemplary embodiments of such systems will next be described.

Figure 1:
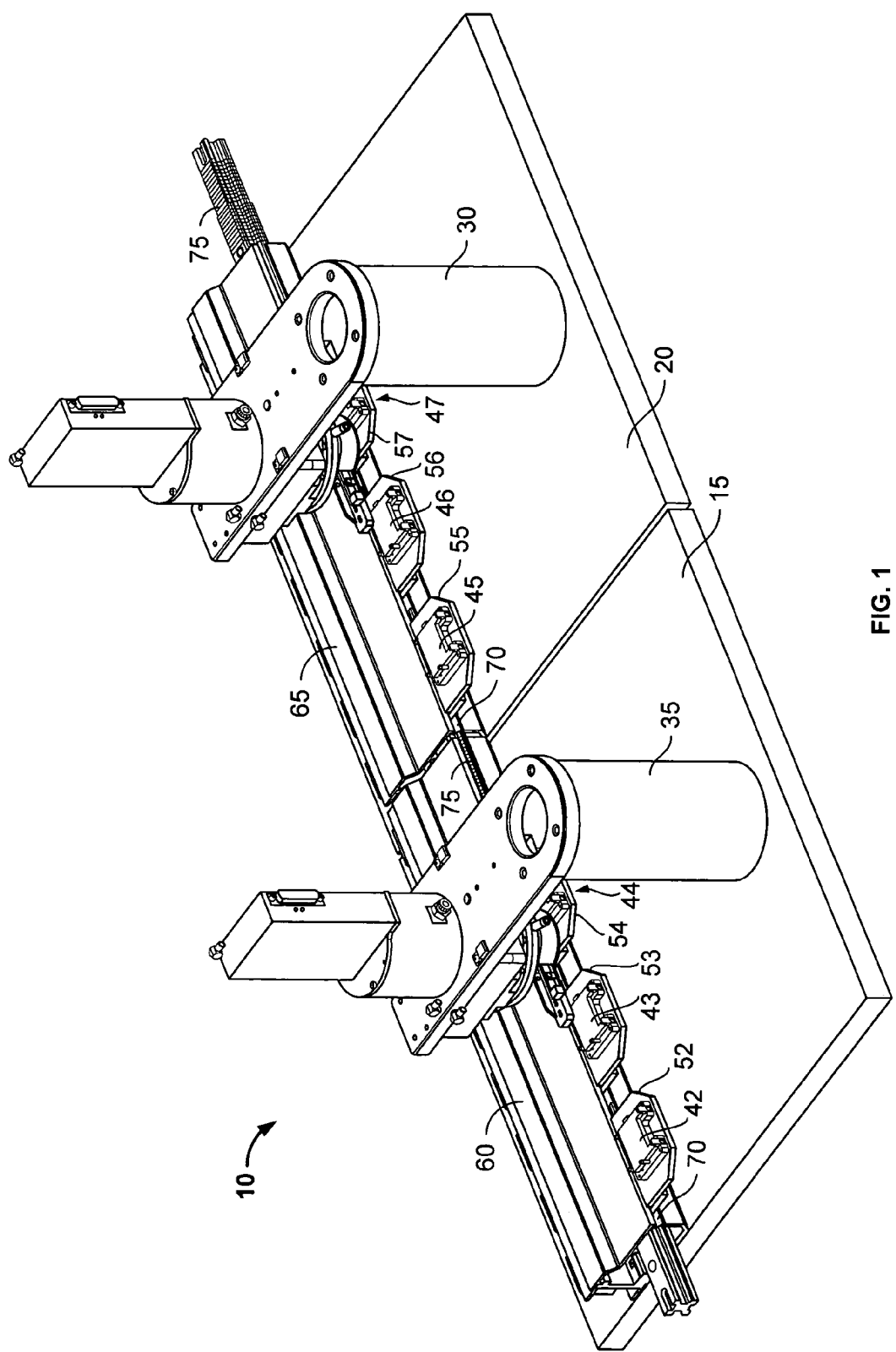
FIG. 1 shows a perspective view of a conveying system with two modules.

FIG. 1 shows a conveying system 10 with two modules 15, 20. Each module 15, 20 may be proximate to one or more processing stations 30, 35. The processing stations 30, 35 may perform various operations on work pieces 42–47 that are transported on pallet assemblies 52–57 being conveyed in the modules 15, 20. The processing stations 30, 35 may perform those operations while the work pieces 42–47 remain in contact with the pallet assemblies 52–57, which are not lifted or oriented. Some examples of operations that processing stations 30, 35 may perform include installing various components on the work pieces 42–47, securing the components to the work pieces 42–47, testing the work pieces 42–47, and inspecting the work pieces 42–47. FIG. 1 shows two processing stations 30, 35—one for each module 15, 20—but any appropriate number of processing stations 30, 35 may be associated with each module 15, 20.

Figure 2:
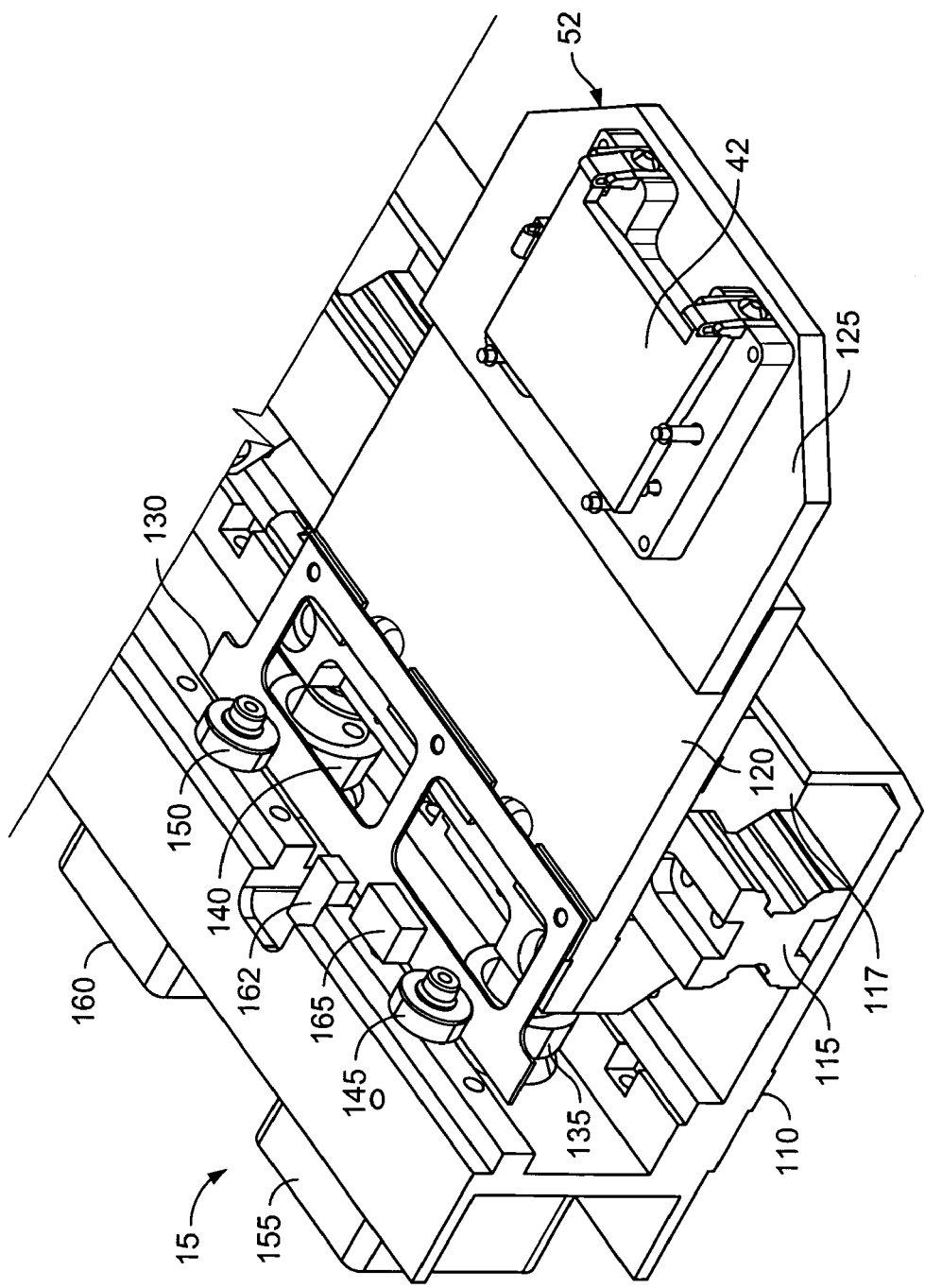
FIG. 2 shows a perspective view of one of the modules shown in FIG. 1 with the cover removed.
Figure 3:
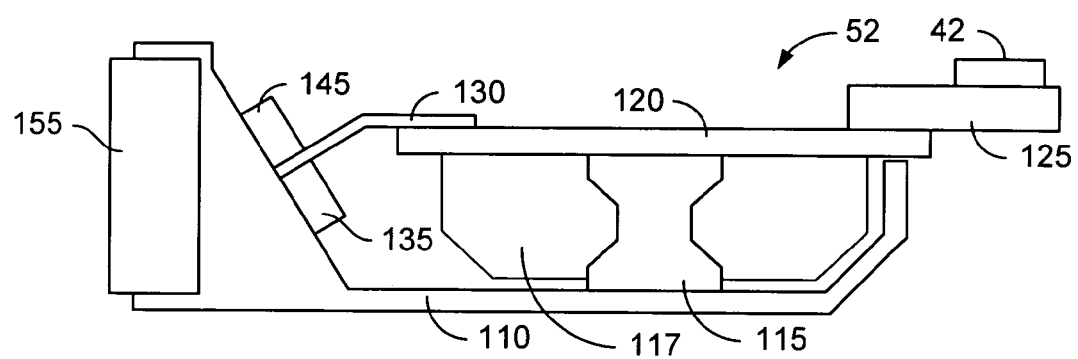
FIG. 3 shows a top view of an alternative embodiment of the implementation shown in FIG. 2.
Figure 4:
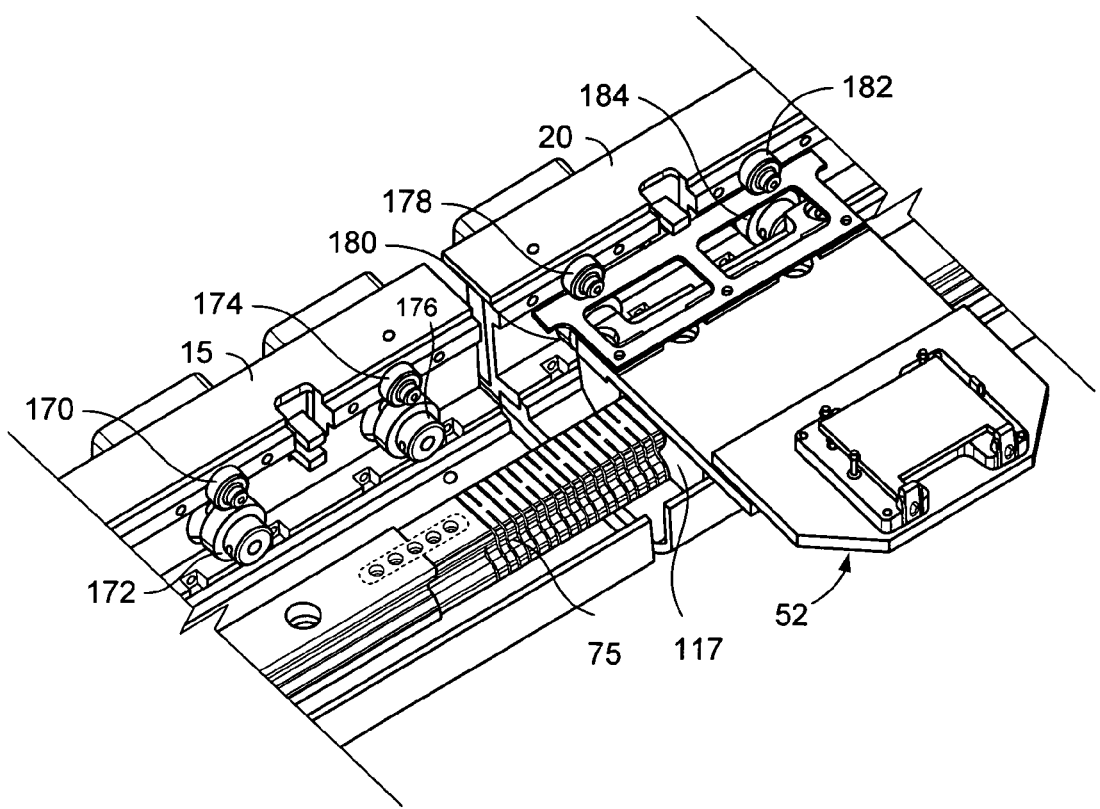
FIG. 4 shows a perspective view of a pallet assembly transitioning between two modules.

Covers 60, 65 may substantially cover the modules' 15, 20 inner components, which are described in more detail in conjunction with FIGS. 2–4. The covers 60, 65 may serve to protect the inner components from contaminants resulting from the various operations being performed by the processing stations 30, 35, 40 on the work pieces 42–47. The covers 60–65 may also serve to protect the work pieces 42–47 from contaminants that may be generated inside the enclosure. The covers 60, 65 may provide a slot 70 through which pallet assemblies 52–57 may protrude as the pallet assemblies 52–57 are conveyed through the modules 15, 20.

Modules 15, 20 may be connected to one another by a coupling 75 that allows pallet assemblies 52–57 to travel from module 15 to module 20. The coupling 75 may be made of flexible material so that pallet assemblies 52–57 may travel from one module 15 to another module 20 even when the modules 15, 20 are slightly misaligned. In a typical manufacture or assembly process, there may be several modules 15, 20. Each module 15, 20 may be coupled to one or two other modules 15, 20 by a coupling 75.

As will be understood from the description below, each pallet assembly 52 may be moved along the rail 115 when engaged by engaging elements that are coupled to an actuator, such as a motor. The engaging elements compressively engage opposing surfaces of the pallet assembly to achieve reduced slippage and permit higher acceleration, for example. The opposing compressive forces engage the work pieces or pallet assemblies in a direction substantially orthogonal to the direction of movement along the rail 115.

A portion of an exemplary conveyor system is illustrated in FIG. 2, which shows a close-up of module 15 with the cover 60 removed to expose the inner components. A base 110 supports a rail 115 along which the pallet assembly 52 travels. The pallet assembly 52 may include a carriage assembly 117 that slidably engages the rail 115, allowing the pallet assembly 52 to travel along the rail 115 substantially without slipping.

The carriage assembly 117 may substantially prevent the pallet assembly 52 from twisting or tipping in relation to the rail 115 as the pallet assembly 52 travels along the rail 115. The pallet assembly 52 may also include a pallet plate 120 that is supported by the carriage assembly 117. The pallet plate 120 may support a pallet nest 125, which may be configured to receive and secure the work piece 42 for transportation and processing by processing stations. The pallet plate 120 may also support a sheet 130, the function of which is discussed in detail below. The components of the pallet assembly 52 may be fastened together in any appropriate way.

The pallet assembly 52 may be modified in several ways. For instance, the sheet 130, the pallet plate 120, and the pallet nest 125 may be integrally formed of the same material. Also, the sheet 130 need not be present at all. Instead, the pallet plate 120 may extend such that it performs function of the sheet 130. The sheet 130 may also be bent, as shown in FIG. 3.

The base 110 of FIG. 2 may also support components that control the position of the pallet assembly 52 along the rail 115. Two of those components may be drive rollers 135, 140 and idler rollers 145, 150. The drive rollers 135, 140 may be made of elastomer, rigid polymer, metal, or other appropriate material. The idler rollers 145, 150 may be made of a conductive polymer and may turn on a metal shaft to provide for substantially continuous electrical contact with (i.e., grounding to) the pallet assembly 52. To mitigate potential problems with electrostatic discharge (ESD), for example, some implementations may provide electrical coupling of the base 110 to an Earth ground potential. The idler rollers 145, 150 may also be made of metal or other appropriate material, and may include ball bearings filled with conductive grease. Each drive roller 135, 140 may be powered by a motor 155, 160. The motor 155, 160 may be a servomotor, a stepper motor, or any other appropriate motor. In this example, the rollers 135, 140, 145, 150 compressively engage opposing surfaces of the pallet assembly 52 to achieve reduced slippage and permit higher acceleration. The opposing compressive forces engage in a direction substantially orthogonal to the direction of movement along the rail 115.

One or more of the motors 155, 160 may be precisely controlled by a controller (not shown). The controller may be a programmable logic controller, a personal computer, a network of computers, or other appropriate mechanism for controlling the motors 155, 160. The controller may be able to signal one or more motors 155, 160 to start, stop, or adjust the speed of the drive rollers 135, 140. A second controller may control a different group of one or more motors 155, 160—for example, motors 155, 160 controlling drive rollers 135, 140 further down the rail 115 or in a different module 15. The second controller may control its group of motors 155, 160 in a manner that is independent of, or asynchronous with, how the first controller controls its group of motors 155, 160. One example of a suitable system for controlling motors in a conveyor system is disclosed in U.S. Pat. No. 6,460,683, which is hereby incorporated by reference in its entirety.

In this example, the controller receives information about the pallet assembly 52 from a sensor 162. The sensor 162 may be, for example, an optical sensor, a Hall Effect sensor, a magnetic code reader, infrared sensor, proximity sensor, thermal sensor, mechanical switch, or other suitable sensor. As the sheet 130 passes the sensor 162, the sensor 162 may detect the presence of the sheet 130. The sensor 162 may communicate the presence or absence of the sheet 130 to the controller. Also in this example, the controller receives information from an encoder 165. Such information may include the location of the pallet assembly 52, the speed the pallet assembly 52 is traveling, identifying or historical information about the pallet, or other relevant information. Historical or identifying information may be encoded on a surface of the pallet assembly, for example, in magnetic, optical (e.g. bar code, apertures, etc. . . . ), mechanical, or other format. The encoder 165 may be, for example, a rotary encoder, a linear-optical encoder, a magnetic encoder, or any other mechanical, optical, magnetic, electric, or other mechanism that can identify or detect the encoded information and transmit the information to a controller. A mechanical device, such as a sliding pin, may also help precisely position a pallet assembly 52 for manufacture or assembly. Such a sliding pin may also be used to engage the pallet assembly 52 after it stops.

In this example, the drive rollers 135, 140 engage one surface of the sheet 130. As shown in FIG. 2, the drive rollers 135, 140 engage the bottom surface of the sheet 130 with opposing and off-setting forces that are substantially orthogonal to the direction of movement along the rail. If the sheet 130 is sufficiently rigid and is pressed against the drive rollers 135, 140, idler rollers 145, 150 may not be necessary. The weight and rigidity, however, of the sheet 130 may not be sufficient to provide enough friction between the drive rollers 135, 140 and the bottom surface of the sheet 130. Insufficient friction would result in the sheet 130 slipping, making precise positioning of the pallet assembly 52 more difficult. The idler rollers 145, 150 substantially prevent such slippage by engaging the opposed surface of the sheet 130—the top surface as shown. The sheet 130 is compressed between the drive rollers 135, 140 and the idler rollers 145, 150, ensuring sufficient friction between the drive rollers 135, 140 and the bottom surface of the sheet 130. Thus, as the drive rollers 135, 140 are driven, the pallet assembly 52 is moved. This may allow an operator to control a pallet assembly's 52 position precisely and with high acceleration by programming a controller to control the motors 155, 160 by generating control commands. In response to these commands, the drive motors may direct the actuation of the drive rollers 135, 140, and thereby direct the movement of objects, such as a work piece or a pallet assembly, along the conveyor.

One or more conductors may be incorporated into the sheet 130 or the pallet assembly 52 to provide an electrically conductive path between a conductive one of the rollers 135–150 and components on the pallet assembly 52 or work piece 42. An exposed conductive area in electrical communication with the conductor may make electrical contact with a conductive surface of one of the rollers as roller engages that portion of the sheet 130 or the pallet assembly 52 that includes the exposed conductive area.

FIG. 3 shows an end view of an exemplary module configuration. One difference is that the sheet 130 is bent downward and is engaged by drive rollers 135 and idler rollers 145, both of which are tilted upward. This configuration operates in the same manner as the configuration of FIG. 2. The drive rollers 135 engage a surface of the sheet 130, and the idler rollers 145 engage the opposing surface of the sheet 130, thereby compressing the sheet 130 into the drive rollers 135. The rollers 135, 145 and the sheet 130 may be configured at any appropriate angle. The opposing forces with which the rollers 135, 145 compressively engage the sheet 130 are substantially orthogonal to the direction of motion along the rail 115.

FIG. 4 shows one embodiment of an exemplary pallet assembly 52 that has just transitioned from the first module 15 to the second module 20. During this transition, the pallet assembly 52 may be vulnerable to binding. As was mentioned in conjunction with FIG. 2, the carriage assembly 117 may substantially prevent the pallet assembly 52 from twisting from side to side or from tipping upward or downward in relation to the rail 115 while traveling along the rail 115. Thus, as the pallet assembly 52 travels substantially without slipping along the coupling 75, which, as mentioned above, may be made of flexible material, the position of the sheet 130 may change with respect to the position of the drive rollers 172, 176, 180, 184 and the idler rollers 170, 174, 178, 182. In such a situation, the pallet assembly 52 may bind. To prevent such binding, the sheet 130 may be made out of flexible material. Examples of such flexible material include stainless steel, other steel alloys, polymer, composites, and other appropriate materials. The flexibility of the sheet 130 allows the drive rollers 172, 176, 180, 184 and the idler rollers 170, 174, 178, 182 to engage the sheet 130 even when the pallet assembly 52 is slightly misaligned due to the flexible coupling 75.

Figure 5A:
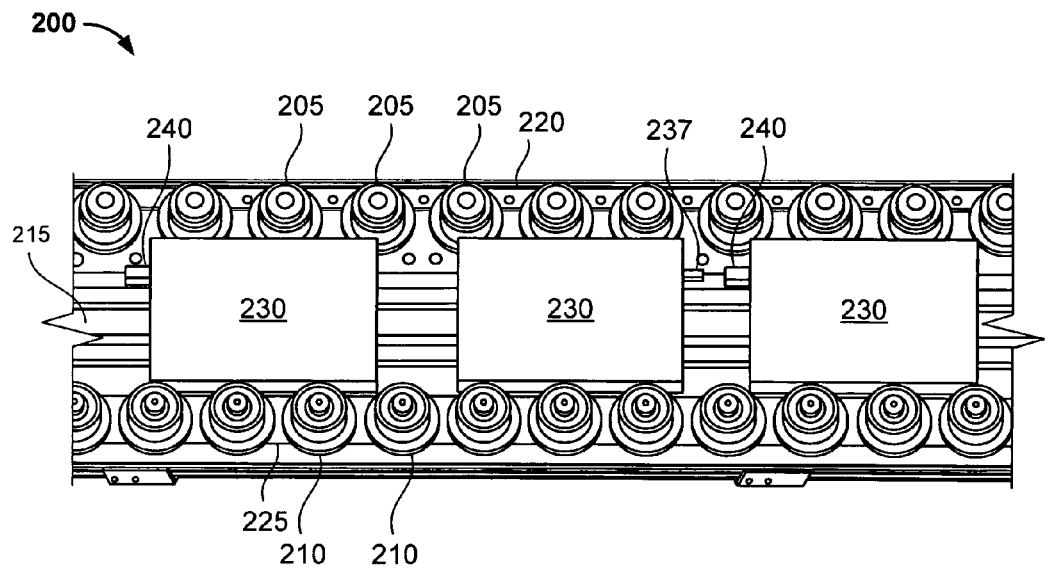
FIGS. 5a and 5b show a perspective view of an alternative conveyor system implementation.
Figure 5B:
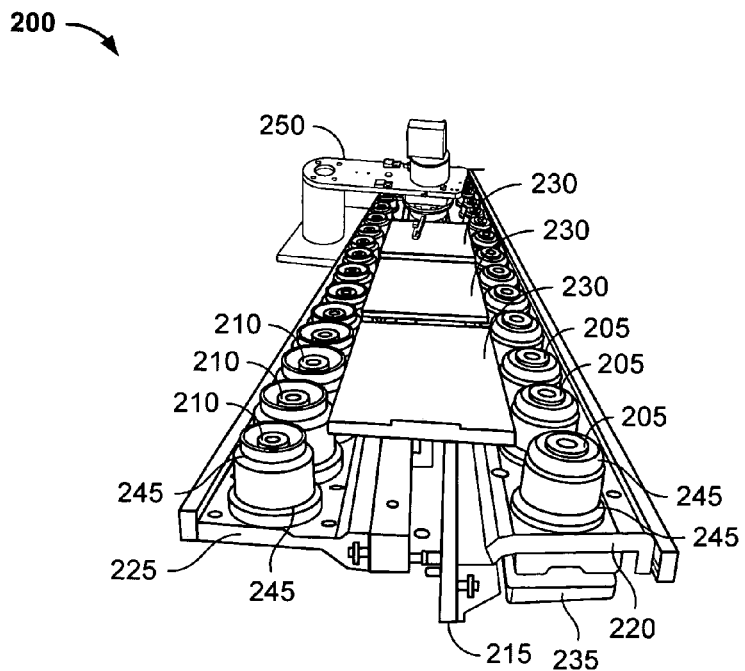

FIGS. 5a–5b show an exemplary embodiment of a conveying system 200 in which rollers 205, 210 rotate about vertical axes and pallet assemblies are not required. A base 215 supports two opposed members 220, 225. One member 220 supports drive rollers 205, and the other member 225 supports idler rollers 210.

Other configurations are possible. For example, one or both members 220, 225 may support a combination of drive rollers 205 and idler rollers 210. The drive rollers 205 may be made of elastomer, rigid polymer, metal, or other appropriate material. The idler rollers 210 may be made of a conductive polymer and may turn on metal shafts to provide for continuous electrical contact with a work piece 230 being conveyed. This may, for example, reduce the build-up of static charge in some implementations and mitigate potential occurrence of ESD events. The idler rollers 210 may also be made of metal or other appropriate material and may include ball bearings filled with conductive grease. Each drive roller 205 may be powered by a motor 235. The motor 235 may be a servomotor, a stepper motor, or any other appropriate motor.

As described above, one or more motors 235 may be controlled by one or more controllers. The controller(s) may receive information about the work piece 230 from a sensor 237, which may be an optical or magnetic sensor, for example, and an encoder 240. Using optical, mechanical, or magnetic sensing methods, the sensor 237 and/or the encoder 240 may provide position, velocity, identity, or other information for the work piece 230.

In operation, the drive rollers 205 may engage one side of the work piece 230, and the idler rollers 210 may engage the other side of the work piece 230. The opposing compressive forces are substantially orthogonal to the direction of movement. For example, the drive rollers 205 may engage opposing surfaces of the work piece 230 such that the opposing forces lie in a substantially horizontal plane, and the work piece may be moved in a substantially horizontal plane that is substantially orthogonal to the opposing compressive forces.

In the illustrated embodiment, each roller 205, 210 is shaped such that its bottom circumference is greater than its top circumference. Further, each roller 205, 210 may have one or more steps 245 so that when the rollers 205, 210 engage the sides of the work piece 230, the work piece 230 is also supported from underneath by the steps 245 of the rollers 205, 210. As the drive rollers 205 rotate, frictional forces made possible by the opposing idler rollers 210 propel the work piece 230 along the conveyor system 200 substantially without slippage. In other embodiments, the rollers may have other suitable shapes, including wholly or partially flat, trapezoidal, or with concave or convex curvature, for example.

In a typical manufacture or assembly process, the controller causes the rollers 205, 210 to position the work piece 230 near one or more processing stations 250 as the work piece travels along the conveyor system 200. The processing stations 250 may perform various operations on the work piece 230, such as installing various components on the work piece 230, securing the components to the work piece 230, testing the work piece 230, and inspecting the work piece 230.

In alternative implementations, the direction of movement may not necessarily lie in a substantially horizontal plane. For example, the direction of movement may be at any angle to the horizontal, including vertical. In addition, the direction of movement may include curves to provide for changes in direction of movement of the work piece.

In certain embodiments, the opposing compressive forces may not lie in a horizontal plane. The opposing compressive forces may engage the work piece when the work piece is in orientations that are not horizontal. For example, the compressive forces on the work piece or pallet assembly may engage the work piece or pallet assembly as it moves along a corkscrew-shaped portion of the conveyor. Thus, in various embodiments, the work piece or pallet assembly may be supported, in whole or in part, by the rail or the engaging elements (e.g., rollers). As such, certain embodiments may be incorporated in process flows that include non-planar or non-linear paths.

Embodiments may also be incorporated into complex configurations to provide for flexibly configurable process flows. For example, embodiments may be incorporated into multi-path conveyor systems in which a work piece may advance along a path that splits into two or more paths, or may advance along a path that joins with one or more other paths into a single path.

In some implementations, the movements of each of a number of work pieces or pallet assemblies may be independently controlled. All of the work pieces may be advanced at the same rate, or each work piece may be advanced, for example, to the extent that a path to the next station is unobstructed. A controller may supervise the movement of each work piece along the conveyor, based upon feedback from local sensors or local controllers configured to provide control signals that determine when work pieces may be advanced.

Controllers for systems that include at least one conveyor system as described herein may, for example, generate control signals in response to certain received information. Information may be received from sensors, or from other local controllers that may provide, for example, status information indicating when a station is ready to accept the next work piece. This information may be processed by digital and/or analog circuits, relays, programmable logic controllers, embedded controllers, or PCs to determine control commands for the conveyor system. Where programmable controllers are used to monitor and control the operation of a conveyor system, or a number of inter-related processing systems that use a conveyor system, software program instructions may be stored, edited, and executed to achieve the control operations. Controllers may be connected to other devices using point-to-point, serial, parallel, wired, wireless, or other physical and/or network architecture (e.g., LAN, WAN, Internet-connected). Controllers may communicate with connected devices using any suitable custom or conventional communication protocol, such as RS-232, RS-485, Ethernet, CAN, Modbus, or Internet protocols, for example.

Although a number of implementations have been described, it will be understood that various modifications are possible. Accordingly, other implementations are within the scope of the following claims.

What is claimed is:

1. A system for conveying components comprising:
    a rail segment;
    a plurality of pallet assemblies, each pallet assembly including a flexible sheet, wherein the flexible sheet has a first surface and a second surface, wherein the second surface is opposed to the first surface;
    a plurality of drive rollers that engage the first surfaces to move the plurality of pallet assemblies along the rail segment; and
    a plurality of idler rollers that engage the second surfaces to increase friction between the drive rollers and the first surfaces to substantially prevent slippage of the flexible sheets relative to rotation of the drive rollers.

2. The system of claim 1, wherein each of the flexible sheets is bent along a line substantially parallel to the respective direction of travel of the respective pallet assembly.

3. The system of claim 1, wherein each positioning mechanism further comprises:
    one or more motors, each motor being operable to drive a drive roller and a controller to control the motors.

4. The system of claim 1, wherein the idler rollers comprise conductive material and the idler rollers provide electrical contact to the pallet assemblies while the idler rollers engage the pallet assemblies.

5. The system of claim 1, further comprising a cover that substantially covers a portion of the rail segment, the drive rollers, and the idler rollers.

6. The system of claim 1, wherein the drive rollers comprise elastomer.

7. The system of claim 1, wherein a first positioning mechanism positions a first pallet assembly near a processing station, allowing the processing station to perform an operation on a work piece being supported by the first pallet assembly while the work piece remains in contact with the first pallet assembly.

8. The system of claim 1, wherein a first positioning mechanism positions a first pallet assembly asynchronously with a second positioning mechanism's positioning of a second pallet assembly.

9. The system of claim 1, wherein the rail segment is a first rail segment, further comprising
a second rail segment, wherein an end of the first rail segment is connected to an end of the second rail segment by a flexible coupling.

10. A system for conveying components comprising:
a plurality of drive rollers; and
a plurality of idler rollers,
wherein the drive rollers are operable to engage a first surface of a work piece and the idler rollers are operable to engage an opposing surface of the work piece,
wherein at least one of the rollers comprises conductive material and provides electrical contact to the work piece when the at least one of the rollers is engaged with the work piece.

11. The system of claim 10, wherein the drive rollers comprise elastomer.

12. The system of claim 10, wherein the rollers are operable to position the work piece near a processing station, allowing the processing station to perform an operation on the work piece while the work piece remains engaged by the rollers.

13. A system for conveying components, the system comprising:
a plurality of modules, each module comprising:
a first engaging element to engage a first surface of an object;
a second engaging element to engage a second surface of the object, wherein the second surface is opposite the first surface, and the first and second elements engage the opposing first and second surfaces with offsetting compressive forces;
an actuator configured to rotate at least the first engaging element to move the object in a direction substantially orthogonal to the offsetting compressive forces and with substantially no slippage; and
at least one flexible coupler for connecting the plurality of modules to form a path along with the object may be moved even if the plurality of modules are misaligned.

14. The system of claim 13, further comprising at least one controller to generate control commands to one or more of the actuators, the control commands determining the movement of one or more objects along the path.

15. The system of claim 14, wherein at least one controller generates control commands to move at least two objects at different rates or at different times.

16. The system of claim 13, further comprising a conductive path between at least one engaging element and a ground potential.

17. The system of claim 13, further comprising a reader means for reading information encoded on the object.

18. The system of claim 13, further comprising detection means for detecting information associated with position or velocity of the object.

19. The system of claim 13, wherein at least one of the engaging elements comprises conductive material to make electrical contact with the object.

20. The system of claim 13, wherein the engaging elements are operable to position the work piece near a processing station that is configured to perform an operation on the object while the object remains engaged by the engaging elements.

21. The system of claim 13, wherein the first engaging element comprises a plurality of drive rollers, and the second engaging elements comprises a plurality of idler rollers, and the first and second surfaces are substantially vertical.

22. The system of claim 2, further comprising a plurality of components coupled to the plurality of pallet assemblies,
wherein the first surfaces and the second surfaces are on first portions of the flexible sheets,
wherein the components connected to second portions of the flexible sheets,
wherein the first portions of the flexible sheets are separated from the second portions of the flexible sheets by the permanent bends.

23. The system of claim 10, wherein the at least one of the rollers includes the plurality of idler rollers.

24. The system of claim 10, wherein the electrical contact supplies a conductive path to a ground potential.

* * * * *